United States Patent
Ahlers et al.

(10) Patent No.: US 7,332,788 B2
(45) Date of Patent: Feb. 19, 2008

(54) SEMICONDUCTOR POWER DEVICE WITH CHARGE COMPENSATION STRUCTURE AND MONOLITHIC INTEGRATED CIRCUIT, AND METHOD FOR FABRICATING IT

(75) Inventors: Dirk Ahlers, München (DE); Miguel Cuadron Marion, München (DE); Uwe Wahl, München (DE); Armin Willmeroth, Augsburg (DE)

(73) Assignee: Infineon Technologies AG (DE)

( * ) Notice: Subject to any disclaimer, the term of this patent is extended or adjusted under 35 U.S.C. 154(b) by 247 days.

(21) Appl. No.: 10/927,270

(22) Filed: Aug. 26, 2004

(65) Prior Publication Data
US 2005/0045922 A1    Mar. 3, 2005

(30) Foreign Application Priority Data
Aug. 28, 2003   (DE) .............................. 103 40 131

(51) Int. Cl.
*H01L 29/00* (2006.01)
(52) U.S. Cl. ...................................... 257/502; 438/336
(58) Field of Classification Search ................ 438/164, 438/206, 207, 336, 361, 430; 257/109, 288, 257/328–330, 500–502, 506, 513, 517, 520, 257/526, E29.195, E29.257, E21.418
See application file for complete search history.

(56) References Cited

U.S. PATENT DOCUMENTS

| | | | |
|---|---|---|---|
| 5,233,215 A * | 8/1993 | Baliga | 257/490 |
| 6,566,201 B1 * | 5/2003 | Blanchard | 438/268 |
| 6,667,514 B2 | 12/2003 | Ahlers et al. | 257/336 |
| 2004/0075410 A1 | 4/2004 | Knab et al. | 318/445 |

FOREIGN PATENT DOCUMENTS

| | | |
|---|---|---|
| DE | 101 32 136 C1 | 2/2003 |
| DE | 101 52 170 A1 | 4/2003 |
| EP | 1 213 766 A2 | 11/2001 |

* cited by examiner

*Primary Examiner*—David Vu
(74) *Attorney, Agent, or Firm*—Coats & Bennett, P.L.L.C.

(57) ABSTRACT

The invention relates to a semiconductor power device with charge compensation structure and monolithic integrated circuit, and method for fabricating it. In the case of this semiconductor power device, zones (6) in charge compensation cells (27) that are arranged vertically and doped complimentarily to the semiconductor chip volume (5) are arranged in the entire chip volume, the complimentarily doped zones (6) extending right into surface regions (11) of the semiconductor power elements (7) and not projecting into surface regions (12) of semiconductor surface elements (1).

10 Claims, 7 Drawing Sheets

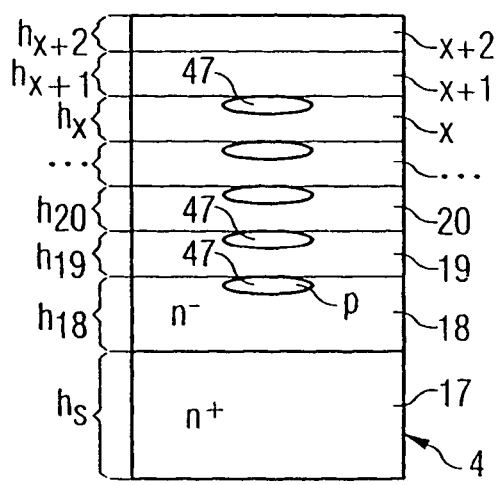
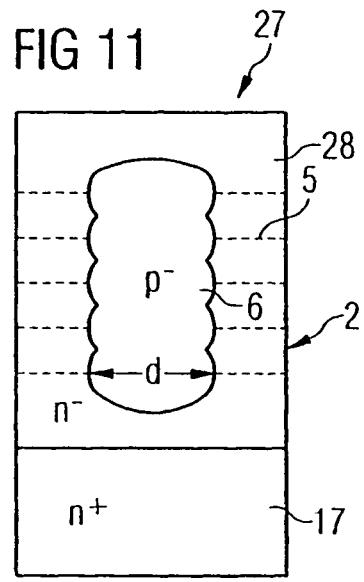
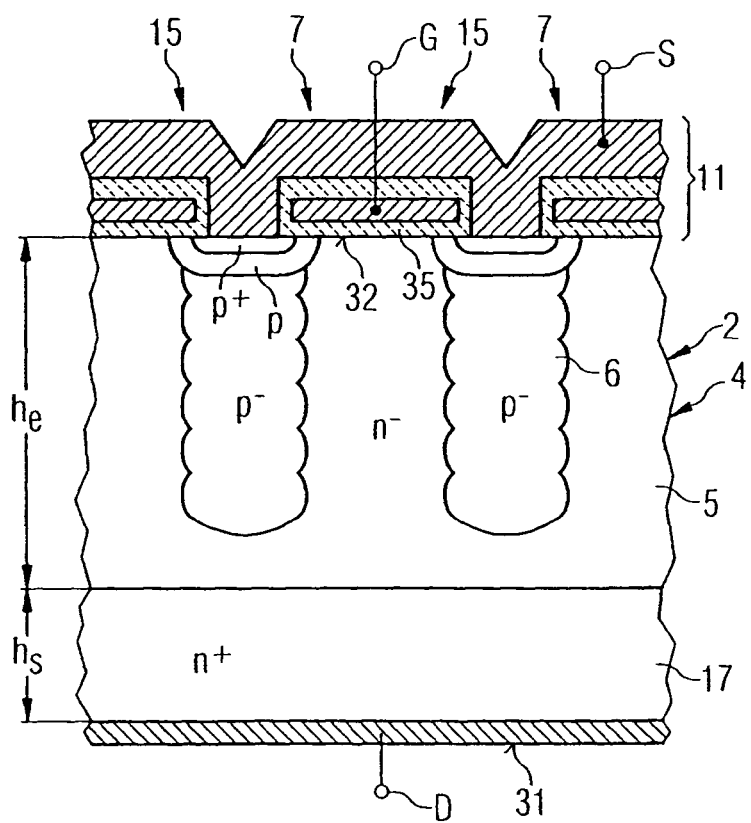

SEMICONDUCTOR POWER DEVICE WITH CHARGE COMPENSATION STRUCTURE AND MONOLITHIC INTEGRATED CIRCUIT, AND METHOD FOR FABRICATING IT

PRIORITY

This application claims priority to German application no. 103 40 131.8 filed Aug. 28, 2003.

TECHNICAL FIELD OF THE INVENTION

The invention relates to a semiconductor device with charge compensation structure and monolithic integrated circuit on a semiconductor chip, the charge compensation structure having charge compensation cells having pillars in the cells that are arranged vertically and doped complimentarily to the semiconductor chip volume or to the cell volume. Furthermore, the invention relates to a method for fabricating the semiconductor power element.

BACKGROUND OF THE INVENTION

A semiconductor component with charge compensation structure is disclosed in the document DE 101 32 136 C1. Such charge compensation structures form the basis of COOLMOS® (registered trademark DE 38844786.5) semiconductor power devices. In the case of such semiconductor power devices with the charge compensation structure, p-type and n-type zones below the actual MOS field-effect transistor structure with source and gate zones, and also below the associated MOS channels are arranged next to one another in the semiconductor volume of the semiconductor power chip or interleaved in one another in such a way that, in the off-state case, their charges can be mutually depleted and that, in the activated state, there results an uninterrupted, low-impedance conduction path from a source electrode near the surface to a drain electrode arranged on the rear side.

The compensation principle is based on a mutual compensation of charges in n- and p-doped zones in the drift region of the vertical MOS transistor. In this case, the zones are spatially arranged such that the path integral over the doping along for example a line running vertically with respect to the pn junction in each case remains below the material-specific breakdown voltage. For this purpose, p-type and n-type pillars or plates or compensation zones may be arranged pairwise in a vertical transistor as is used in power electronics.

By virtue of the extensive compensation of the p-type and n-type dopings, the doping of the current-carrying region can be significantly increased in the case of compensation components which results in a significant reduction of the on-state resistance despite the loss of a current-carrying area. The reduction of the on-state resistance of such semiconductor power devices is associated with a reduction of the heat loss, so that such semiconductor power devices with charge compensation structure remain "cool" compared with conventional semiconductor power devices.

On account of the pillar structure of the charge compensation cells that extend over the entire top side and the volume of the semiconductor chip of the semiconductor power device the problem arises of arranging signal-processing and/or controlling, integrated circuits monolithically on the semiconductor chip of the semiconductor power device. A further problem consists in isolating the region of the semiconductor circuit elements for the integrated circuit from the region of the semiconductor power elements, especially as the drift zone is relatively highly doped in the semiconductor chip with COOLMOS® semiconductor power devices. With the introduction of a deep p-type well, for example for n-MOS transistors or CMOS structures of a monolithic integrated circuit, this leads to a reduction of the breakdown voltage for the semiconductor power device.

SUMMARY OF THE INVENTION

It is an object of the invention to specify a semiconductor power device with charge compensation structure and monolithic integrated circuit, and also a method for fabricating it, by means of which the problems presented above are overcome. In this case, the intention is to achieve an extensive decoupling of semiconductor circuit elements of a monolithic integrated circuit from the region of the semiconductor power elements.

This object can be achieved by means of a semiconductor power device with charge compensation structure and monolithic integrated circuit on a semiconductor chip, the charge compensation structure with charge compensation cells comprising zones in the cells that are arranged vertically and doped complimentarily to the semiconductor chip volume or to the cell volume, both in the region of the semiconductor power elements of the semiconductor chip and in the region of the semiconductor circuit elements of the monolithic integrated circuit, and the complimentarily doped zones extending right into the surface regions of the semiconductor power elements and not projecting into surface regions of the semiconductor circuit elements.

Pillars can be provided as complimentarily doped and vertically arranged zones. Strip-type parallelepipeds can be provided as complimentarily doped and vertically arranged zones. A corridor surrounding the monolithic integrated circuit can be provided between the region of the semiconductor power elements and the region of the semiconductor circuit elements, in which corridor the zones of the charge compensation structure have a greater distance from one another than in the region of the semiconductor power elements. A corridor surrounding the monolithic integrated circuit can be provided between the region of the semiconductor power elements and the region of the semiconductor circuit elements, in which corridor pillars are provided as complimentarily doped zones, which have a smaller diameter than in the region of the semiconductor power elements. The semiconductor circuit elements can be surrounded by complimentarily doped wells in the region of the semiconductor circuit elements of the integrated circuit. For a well made of n-conducting material, the charge compensation structure may not project into the well region, and the charge compensation cells may have p-conducting pillars whose upper region is widened below the well in such a way that the cell volume in the upper region is also p-conducting, and the upper regions form a closed p-conducting layer that downwardly delimits the n-conducting well. For a well made of n-conducting material, in the region of the semiconductor circuit elements, the edges of the well can be surrounded by a charge compensation structure with p-conducting zones, the zones extending with their head regions as far as the top side of the semiconductor material of the semiconductor chip, and the head region of the p-conducting zones being widened in such a way that the cell volume in the head region is p-conducting and the well is laterally delimited by p-conducting material. For a well made of p-conducting material, the charge compensation structure may end with p-conducting zones below the well, and in the n-conducting pillar-free region near the surface, a conducting well can be arranged in large-area fashion in comparison with the cross section of the charge compensation cells the head regions of the p-conducting zones being at a vertical distance from the p-conducting well that is greater than or equal to the width of the p-conducting zones. The region of the semiconductor power elements may have MOS power transistors and the region of the semiconductor circuit elements may have CMOS structures.

The object can also be achieved by a method for fabricating a semiconductor power device with charge compensation structure and monolithic integrated circuit, the method comprising the steps of:

(a) providing an n$^+$-doped semiconductor wafer,
(b) growing an n-doped epitaxy layer,
(c) applying a photolithography mask with charge compensation cell structure having circular or strip-type openings with a grid dimension or pitch for charge compensation zones within a cell volume,
(d) implanting acceptor ions in the openings,
(e) removing the photolithography mask,
(f) repeating steps b) to e) x times where x is an integer,
(g) repeating steps b) to e) twice in the surface regions provided for semiconductor power elements, in which case, during the first repetition, use is made of a photolithography mask that completely covers the region of the integrated circuit and, during the second repetition, use is made of a photolithography mask that has, in the region of the semiconductor circuit elements of the integrated circuit, a large-area opening for a p-conducting well which extends over the entire region of the integrated circuit and is implanted with acceptor ions during the second repetition,
(h) introducing the semiconductor wafer with the x+2 epitaxy layers and the x+2 implanted acceptor ion sources into a diffusion furnace and diffusing the acceptor ion sources to form conducting pillars and to form a conducting well in the region of the integrated circuit,
(i) carrying out of further masking steps, ion implantation steps, oxidation steps and metalization steps jointly in the region of the semiconductor power elements and the region of the semiconductor circuit elements up to the completion of the semiconductor power elements and the semiconductor circuit elements.

The object can furthermore be achieved by a method for fabricating a semiconductor power device with charge compensation structure and monolithic integrated circuit, the method comprising the steps of:

(a) providing an n$^+$-doped semiconductor wafer,
(b) growing an n-doped epitaxy layer,
(c) applying a photolithography mask with charge compensation cell structure having circular or strip-type openings with a grid dimension or pitch for charge compensation zones within a cell volume,
(d) implanting acceptor ions in the openings,
(e) removing the photolithography mask,
(f) repeating steps b) to e) x times where x is an integer,
(g) applying of an x+1 photolithography mask with charge compensation cell structure having openings with a grid dimension or pitch for charge compensation zones in a cell volume, the openings being widened in the region of the semiconductor circuit elements, so that, during the subsequent implantation and diffusion step, a closed conducting layer is formed in the region of the semiconductor circuit elements as a lower boundary of an n-conducting well,
(h) applying of an x+2 photolithography mask with charge compensation cell structure having openings with a grid dimension or pitch for charge compensation zones in a cell volume, the openings being widened in edge regions of the integrated circuit, and the remaining region of the integrated circuit being covered, so that a p-conducting zone which surrounds the integrated circuit and which surrounds an n-conducting well is formed during the subsequent implantation and diffusion step.

The invention provides a semiconductor power device with charge compensation structure and monolithic integrated circuit on a semiconductor chip. For this purpose, the charge compensation structure with charge compensation cells has pillars in the cells that are arranged vertically and doped complimentarily to the semiconductor chip volume or to the cell volume, both in the region of the semiconductor power components of the semiconductor chip and in the region of the semiconductor circuit elements of the monolithic integrated circuit. In this case, the complimentarily doped pillars extend right into the surface regions of the semiconductor power components, but do not project into the surface region of the semiconductor circuit elements.

If that region of a complimentarily doped pillar which projects into the surface region of the semiconductor power elements is designated as the pillar head or pillar capital, then according to the invention the pillars below the monolithic integrated circuit have no capitals or no heads. The complimentarily doped pillars lack a topmost dopant implantation in this region. Rather, the pillars are connected to one another via a complimentarily doped well, it being possible to set the breakdown voltage by means of the distance between the pillars and the pillar diameter for different complimentarily doped wells. Thus it is possible to suitably choose the complementary doping of the well for the integration of integrated circuits with "smart" function and at the same time to configure the breakdown voltage of this region for the integrated circuit elements to be higher than in the semiconductor power element region.

Preferably, three aspects of the invention are implemented. In a first aspect, the complimentarily doped pillars are doped with an acceptor and form the p-type pillars of the substructure that reach as far as a p-type well of the monolithic integrated circuit. In the case of this configuration, however, the p-type well of the integrated circuit is not permitted to be held at positive potential since it might otherwise be discharged via a pn diode toward the drain. However, negative potentials, for example of 50 V, are possible, which are limited by the blocking capability of the isolating region between monolithic integrated circuit and the COOLMOS® region. In this case, however, the charge of the drift zone below the monolithic integrated circuit with its p-type well, during the switching of the COOLMOS® flows away into the p-type well of the monolithic integrated circuit.

The second aspect also presupposes that the complimentarily doped pillars are p-type pillars, but that the p-type wells are isolated from the pillars arranged underneath, this being achieved by means of headless pillars or pillars without a capital. This second variant affords, above the pillars, an insulated n-conducting well into which p-channel MOS transistors can be integrated. A p-conducting well that is additionally incorporated into said n-conducting well may assume both a positive and a negative potential with respect to the source of the COOLMOS®.

In order, in the case of the second aspect, to dissipate the charge of the drift zone below the monolithic integrated circuit during the switching of the COOLMOS®, the topmost regions of the headless pillars may be designed such that the p-type zones of adjacent pillars are connected to one another. This can be achieved by suitable choice of the pillar grid or by higher doping of these layers or by larger resist openings during the implantation of the acceptor sources.

Both aspects make it possible for additional functions to be monolithically integrated into the active zone of the COOLMOS® without impairing the blocking properties of the COOLMOS®.

A further advantage of the semiconductor power device according to the invention relates to production, in the course of which no additional photoresist planes or photoresist masks are required at least for the substrate, i.e. for the fabrication of the pillar construction for the drift path of the charge compensation structure.

In a third aspect of the invention, a corridor surrounding the monolithic integrated circuit is provided between the region of the semiconductor power elements and the region of the semiconductor circuit elements. In the corridor, the pillars of the charge compensation structure may have a greater distance from one another than in the region of the semiconductor power elements. This embodiment of the invention overcomes a disadvantage that occurs in the second variant of the invention, in which the pillars are short-circuited via the p-type well in the upper part of the substructure structure. This results in a shunt between the region of the semiconductor power components and the monolithic integrated circuit, which causes corresponding leakage currents.

On account of the corridor with greater distances between the p-type pillars that is provided in the third aspect of the invention, the p-type zones, in the head region of the pillars do not diffuse to such an extent that a shunt that can occur in the second aspect is prevented. Consequently, the third aspect of the invention enables a monolithic integrated circuit to be accommodated in the active zone of the COOLMOS® without restricting the blocking properties of the COOLMOS®. What is more, this structure also does not require additional process steps or mask changes in the lower region with the pillar structure.

In a further embodiment of the invention, it is provided that a corridor surrounding the monolithic integrated circuit is arranged between the region of the semiconductor power elements and the region of the semiconductor circuit elements, in which corridor the pillars have a smaller diameter than in the region of the semiconductor power elements. In this case, although different masks or masks which are to be newly designed are to be provided for the substructure of the semiconductor power chip, this achieves an improved isolation of the potentials between the surface region of the semiconductor chip with semiconductor circuit elements and the surface region of the semiconductor chip with semiconductor power elements.

Furthermore, it is provided that the semiconductor circuit elements are surrounded by a complimentarily doped frame in the region of the semiconductor circuit elements of the integrated circuit. This has the advantage that the semiconductor circuit elements of the integrated circuit are insulated from the remaining active structure of the COOLMOS® by a pn junction. In this case, the charge compensation structure with its p-conducting pillars does not project into a well made of n-conducting material into the n-conducting well region. The charge compensation cells arranged underneath have p-conducting pillars whose head region is widened below the well in such a way that the cell volume in the head region is also p-conducting and the head regions form a closed p-conducting layer that downwardly delimits the n-conducting well.

What is more, a well made of n-conducting material, in the region of the semiconductor circuit elements, may be surrounded by a charge compensation structure with p-conducting pillars, the pillars extending with their head regions as far as the top side of the semiconductor material of the semiconductor chip. At the same time, the head region of the conducting pillars may be widened in such a way that the cell volume in the head region is p-conducting and the well for monolithic integrated circuit is also laterally delimited by p-conducting material.

Furthermore, a well made of p-conducting material for the monolithic integrated circuit may be surrounded by a charge compensation structure with p-conducting pillars, but the p-conducting pillars below the well do not reach as far as the p-conducting well and, in the region near the surface, an n-conducting and pillar-free section is arranged between the p-conducting pillars and the p-conducting well. Consequently, a p-conducting well may be arranged in large-area fashion in comparison with the cross section of individual charge compensation cells.

In this case, the capital-free or headless p-conducting pillars are at a vertical distance from the p-conducting well that is greater than or equal to the pillar diameter. In the case of this structure, the breakdown voltage between the p-conducting well and the surrounding n-conducting region near the surface can be adapted to the breakdown voltage of the COOLMOS®. Preferably, the region of the semiconductor power elements as MOS power transistors and the region of the semiconductor circuit elements has a CMOS structure. While the CMOS structures switch signal currents in the microamperes range and store signal potentials in the 100 MV range, the MOS power transistors switch supply currents in the amperes range and voltage potentials in the 100 volts range.

A method for fabricating a semiconductor power device with charge compensation structure and monolithic integrated circuit has the following method steps.

Firstly, an n$^+$-doped semiconductor wafer is provided. The donor concentration of the n$^+$-doped semiconductor wafer lies between a few $10^{18}$ cm$^{-3}$ and $10^{21}$ cm$^{-3}$, for which purpose preferably phosphorus or arsenic is introduced as donor material substitutionally into a monocrystalline silicon lattice. An n-doped epitaxial layer having a thickness of 5 to 30 μm with a donor concentration of $10^{13}$ to $10^{16}$ cm$^{-3}$ is grown on said semiconductor wafer having a thickness of between 90 and 200 μm.

A photolithography mask for a charge compensation cell structure is deposited onto said n$^-$-doped epitaxial layer and patterned photolithographically. The photolithographically patterned resist mask has the openings with a grid dimension or pitch for charge compensation pillars in each of the cell volumes. Afterward, acceptor ions are implanted in the openings, which serve as a source for constructing a p-conducting pillar.

Afterward, the photolithography mask is removed and an n$^-$-doped epitaxial layer is again applied, which is followed by the application of the photolithography mask and a renewed implantation step through the openings for fabrication of the charge compensation pillars in the cell volumes.

This procedure is repeated x times where x is an integer, and sources of acceptor ions are thus present in a manner stacked one above the other in the respective epitaxial layers. These pillar fabrication steps are then repeated a further once to twice, but restricted to the surface regions provided for the semiconductor power elements. In this case, use is made of a photolithography mask that completely covers the region of the integrated circuit.

During the x+2-th repetition, use may be made of a photolithography mask having, in the region of the semiconductor circuit elements of the integrated circuit, a large-area opening for a p-conducting well which extends over the entire region of the integrated circuit and is implanted with acceptor ions during the x+2-th repetition.

As an alternative, it is possible to carry out only an x+1-th repetition and to use a photolithography mask having, in the region of the semiconductor circuit elements of the integrated circuit, a plurality of openings for p-conducting wells which extend over the partial region of the integrated circuit and are implanted with acceptor ions during the x+1 repetition. This gives rise to p-conducting wells into which n-channel MOS field-effect transistors can be incorporated, which, however, are connected to the p-conducting pillars of the charge compensation structure.

The semiconductor with x+1 or the x+2 epitaxial layers, having a thickness of approximately 30 to 60 μm, is then introduced into a diffusion furnace. At temperatures of between greater than 800° C. and up to 1 250° C., the acceptor ions of the acceptor ions sources diffuse to form p⁻ conducting pillars with an acceptor concentration of between $10^{15}$ and $10^{16}$ cm$^{-3}$. In the topmost epitaxial layer, there arise in this case one or a plurality of p⁻-conducting wells with a concentration of $10^{15}$ to $10^{16}$ in the region of the integrated circuit.

Further masking steps, implantation steps, oxidation steps and metalization steps are then carried out jointly in the region of the semiconductor power elements and in the region of the semiconductor circuit elements up to the completion of the semiconductor power elements and the semiconductor circuit elements.

This method has the advantage that a multiplicity of semiconductor power chips arranged in rows and columns with a charge compensation structure are produced simultaneously on the semiconductor wafer, in which case, in the region of the active zone for the semiconductor power components, a region arises which has a monolithic integrated circuit that can control and test the power components in the region of the semiconductor power elements and store and register their switching state. The method furthermore has the advantage that it combines the method steps for fabricating semiconductor power chips on a MOS basis with the method steps fabricating signal circuit components of an integrated circuit on the basis of n-MOS, p-MOS and CMOS in such a way that a monolithically constructed module is produced.

In a further example of carrying out the method for fabricating a semiconductor power device with charge compensation structure and monolithic integrated circuit, the first fabrication steps up to the fabrication of the x-th epitaxial are retained. A lithography mask having openings with a grid dimension or pitch for charge compensation pillars in a cell volume is applied as x+1 photolithography mask with charge compensation cell structure, the opening being widened in the region of the semiconductor circuit elements, so that, during the subsequent implantation and diffusion step, a closed, conducting layer is formed in the region of the semiconductor circuit elements as the lower boundary of an n⁻-conducting well.

Afterward, an x+2 photolithography mask with charge compensation cell structure is applied, having openings with a grid dimension or a pitch for charge compensation pillars in a cell volume, the openings being widened in the edge regions of the integrated circuit and the remaining region of the integrated circuit being covered, so that a p-conducting zone which surrounds the integrated circuit and which surrounds the edges of an n⁻-conducting well is formed during the subsequent implantation and diffusion step.

This method variant advantageously makes it possible to produce the prerequisite for the application of a monolithic integrated circuit in an n-conducting well on a semiconductor power chip. The further advantage is the same as in the first variant, namely that corresponding semiconductor power chips are fabricated simultaneously for a plurality of semiconductor power devices.

In order to provide an isolating region between the monolithic integrated circuit and the region of the semiconductor power elements on the semiconductor wafer in each of the device positions an isolating region—referred to hereinafter as "corridor"—is incorporated. This isolating region may have a pillar grid identical to that of the active parts of the charge compensation structure. On account of the greater distance between the diffused p-type zones, these p-conducting pillar zones are not contiguous, so that a shunt such as occurs when widening the p-type zones in the x+1 step is not expected. In order to ensure this structure with a corridor all around the monolithic integrated circuit, all the photolithography masks for each of the epitaxial layers are to be modified, in which case, in order to obtain a greater distance between the pillars, it is also possible to reduce the pillar diameter in the corridor region.

After the fabrication of the basic structure for a semiconductor power device with charge compensation in each device position of a semiconductor wafer, and also after the various oxidation and metalization steps have been carried out, by means of which, on the one hand, the integrated circuit can be wired and, on the other hand, the large-area drain terminal is prepared by mirror-coating the rear side of the wafer, the semiconductor wafer can be separated into individual semiconductor power chips with monolithic integrated circuit and be provided with corresponding external contact terminals, the semiconductor chip with the external contact terminals finally being packaged in a corresponding device housing.

BRIEF DESCRIPTION OF THE DRAWINGS

The invention will now be explained in more detail with reference to the accompanying figures.

FIGS. 7 to 12 show schematic sketches of individual intermediate products during the fabrication of a charge compensation cell of a semiconductor power element;

FIG. 7 shows a diagrammatic cross section through an $n^+$-doped substrate with a first epitaxial layer having been grown;

FIG. 8 shows a diagrammatic plan view of a photolithography mask with openings for an ion implantation;

FIG. 9 shows a diagrammatic cross section through the substrate in accordance with FIG. 7 with an implanted acceptor zone;

FIG. 10 shows the substrate of FIG. 7 with x+2 epitaxial layers and x acceptor zones after corresponding epitaxial and corresponding ion implantation steps;

FIG. 11 shows the substrate of FIG. 7 with x+2 epitaxial layers and a diffused $p^-$-conducting pillar;

FIG. 12 shows a diagrammatic cross section through two semiconductor power elements.

PREFERRED EMBODIMENTS OF THE INVENTION

Figure 1:
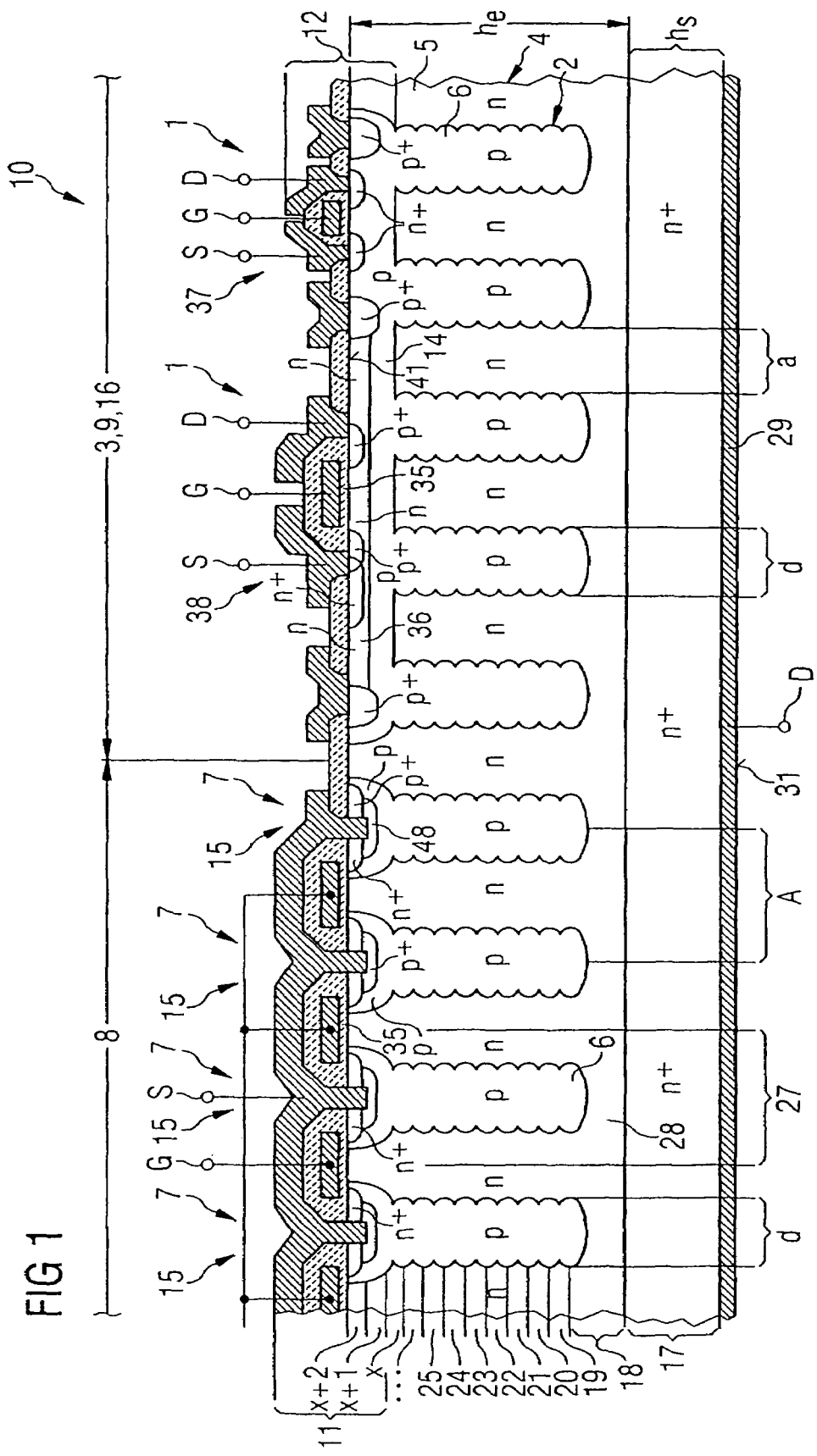
FIG. 1 shows a diagrammatic cross section through a semiconductor chip of a semiconductor power device of a first embodiment of the invention.

FIG. 1 shows a diagrammatic cross section through a semiconductor chip 4 of a semiconductor power device 10 of a first embodiment of the invention. The semiconductor power device 10 has a charge compensation structure 2. In the semiconductor chip volume 5 above said power compensation structure 2 there are arranged both a region 8 with semiconductor power elements 7 that form a vertical MOS transistor 15 and a region 9 having semiconductor circuit elements 1 of a monolithic integrated circuit 3. In this case, complimentarily doped pillars 6 made of $p^-$-conducting monocrystalline material extend in the vertical direction right into surface regions 11 of the semiconductor power components 7.

The charge compensation structure 2 with its charge compensation cells 27 and the $p^-$-conducting pillars 6 does not project into a surface region 12 for the semiconductor circuit elements 1, but rather touches, with the topmost pillar region, a $p^-$-conducting well 14 that extends over the entire region 9 of the semiconductor circuit elements 1. In this embodiment of the invention, the region 8 of the semiconductor power elements 7 has the same substructure as the region 9 of the semiconductor circuit elements 1.

The basis of the semiconductor chip 4 is formed by an $n^+$-conducting semiconductor material, preferably silicon, with a thickness $h_s$ of the substrate 17 having a magnitude of 90 to 200 µm and a phosphorus doping with a concentration of a few $10^{18}$ to $10^{21}$ cm$^{-3}$. By virtue of the phosphorus doping, the substrate 17 becomes negatively conducting, so that a large-area metal electrode 29 that covers the entire rear side 31 of the semiconductor chip 4 as drain contact D of the semiconductor circuit device 10 forms an ohmic contact with the $n^+$ conducting substrate 17. An $n^-$-conducting epitaxial layer 18 having a thickness of 5 to 30 µm and having a donor concentration of $10^{13}$ to $10^{16}$ cm$^{-3}$ is grown on the substrate.

This is followed by growth of a plurality of epitaxial layers 19 to 25 and x which have an $n^-$-conducting basic doping and in each case exhibit pillar-like regions made of $p^-$-conducting material. The concentration of donors in the $p^-$-conducting material lies between $10^{15}$ and $10^{16}$ cm$^{-3}$ in the same way as the $n^-$-conducting cell volume 28 surrounding the $p^-$-conducting pillars 6.

A charge compensation structure 2 arises on account of the complementary doping of the pillars 6 and the cell volume 28. When a reverse voltage is applied between drain and source with the channel of the MOS power transistors being switched off, said charge compensation structure 2 effects a depletion of the charge carriers in the drift zone between source S and drain D on account of the pn junctions of the charge compensation structure 2 that are opposite one another at a distance of 10 to 50 µm, with the result that no current can flow between source S and drain D. The application of a voltage lying above the threshold voltage of the MOS field-effect transistor to the gate electrode G initiates a low-impedance activation between source S and drain S via the vertical structure of the charge compensation cells 27.

In this embodiment of the invention, the region 9 of the semiconductor circuit elements 1 has a CMOS structure 16, an n-channel MOS transistor 37 being shown on the right-hand side of the illustration, which transistor forms its n-channel directly in the p-conducting well 14, while for the p-channel MOS field-effect transistor 38 a further n-conducting well 41 is arranged in the surface region 12 of the semiconductor circuit elements 1 in order to realize the p-channel MOS field-effect transistor 38.

In this first embodiment of the invention, the p-conducting pillars 6 of the charge compensation structure 2 reach as far as the p-conducting well 14 of the CMOS structure 16, so that the p-conducting pillars 6 can be discharged via said well 14. The provision of the p-conducting pillars 6 below the p-conducting well 14 means that the breakdown voltage can be set by way of the distance a between the pillars and the pillar diameter d for different p-type well dopings. It is thus possible to suitably choose the p-type well doping for the monolithic integration of the semiconductor circuit, and at the same time to keep the breakdown voltage of this semiconductor circuit zone above the breakdown voltage of the region 8 of the semiconductor power elements 7. As far as the structure of the semiconductor power elements 7 is concerned, this structure is a typical COOLMOS® structure for power semiconductor circuits with minimized forward resistance and thus with minimal heat loss.

Figure 2:
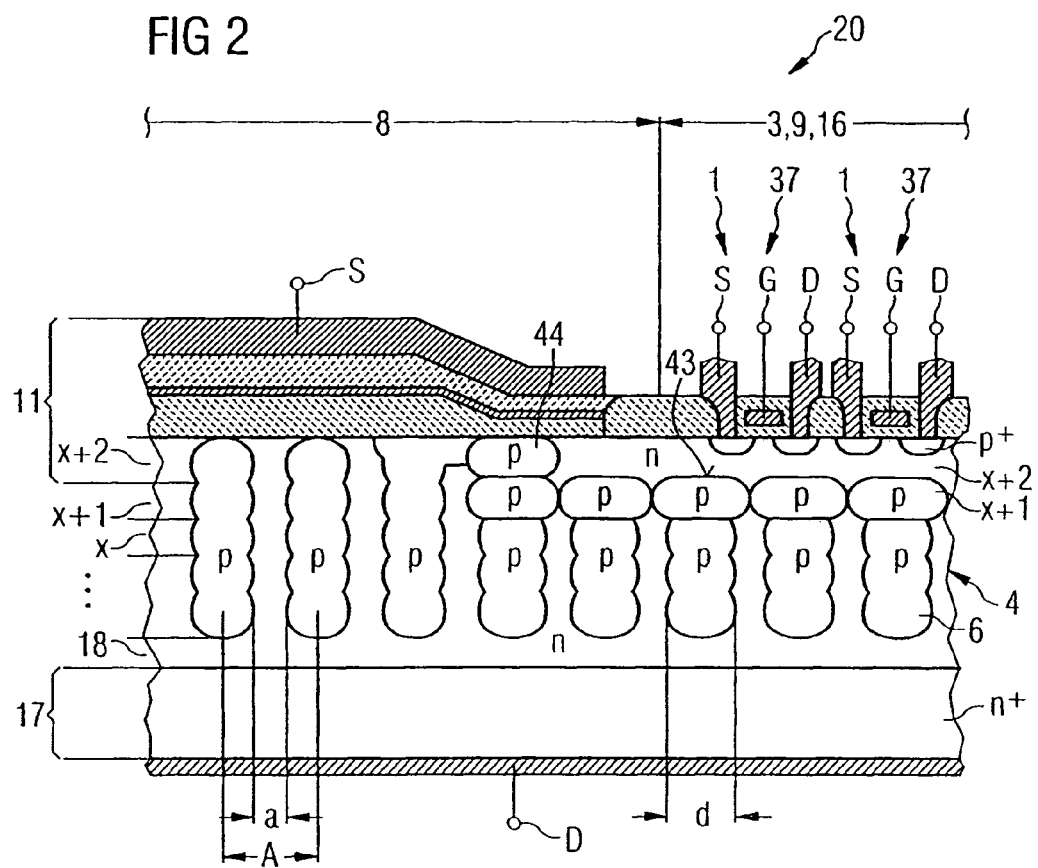
FIG. 2 shows a diagrammatic cross section through a semiconductor chip of a semiconductor device of a second embodiment of the invention.

FIG. 2 shows a diagrammatic cross section through a semiconductor chip 4 of a semiconductor power device 20 of a second embodiment of the invention. This cross-sectional view only shows a detail exhibiting the formation of an n-conducting well 36 for a monolithic integrated circuit with p-channel MOS field-effect transistors 38. A schematic sketch of this type for two MOS transistors 37 of this type with source S, gate G and drain D electrodes can be seen at the top right edge of the illustration. The n-conducting well 36 is delimited by a semiconductor structure comprising p-conducting pillars 6, the x+1 epitaxial layer having widened p-conducting zones that are patterned in such a way that the upper regions 42 of the p-conducting pillars 6 of the charge compensation structure 2 touch one another and thus form a closed underside 43 for the n-conducting well 36, while laterally the topmost layer 44 of the p-conducting pillars 6 is likewise widened in such a way as to form a closed edge all around the n-conducting well 36. The rest of the structure corresponds to the embodiment of the invention shown in FIG. 1.

Figure 3:
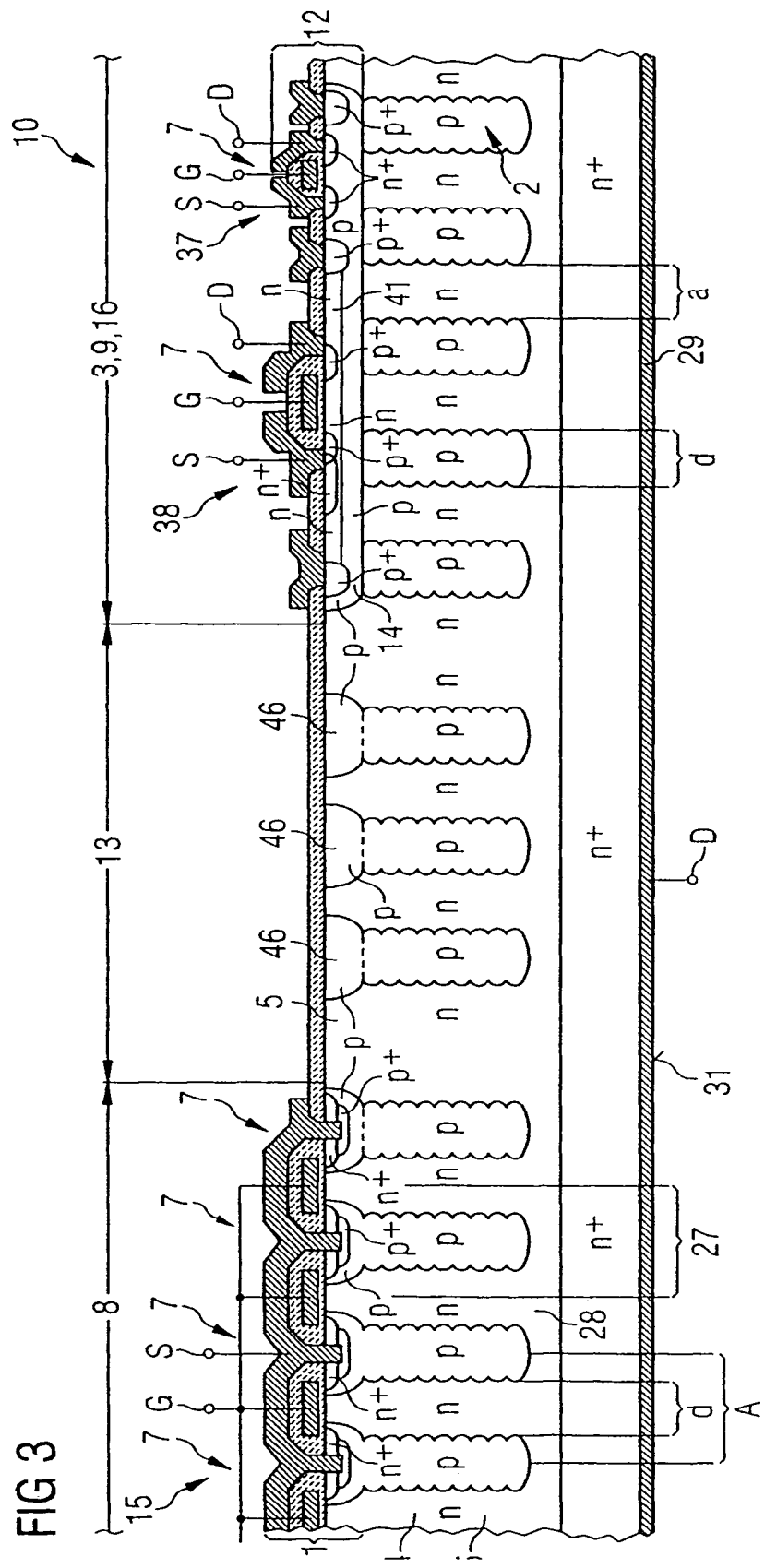
FIG. 3 shows a diagrammatic cross section through a semiconductor chip of a semiconductor power device of a third embodiment of the invention.

FIG. 3 shows a diagrammatic cross section through a semiconductor chip 4 of a semiconductor power device 30 of a third embodiment of the invention. This third embodiment of the invention with the semiconductor power device 30 differs from the first two embodiments in accordance with FIGS. 1 and 2 by the fact that a corridor 13 is provided between the region 9 of the semiconductor circuit elements 1 and the region 8 of the semiconductor power elements 7. Said corridor 13, as an isolating region, surrounds the region 9 with the semiconductor circuit elements 1 and ensures that a shunt such as may occur in the second exemplary embodiment of the invention in accordance with FIG. 2 is now prevented since the structure of the monolithic integrated semiconductor circuit is surrounded by a pillar grid whose pillars 46 are spaced apart from one another.

This spacing is enlarged so that the zones of the pillars 46 cannot diffuse together and a shunt is thus prevented. This construction makes it possible to realize potential differences between the active cell region of the COOLMOS® and the "smart" region of the monolithic integrated circuit without electrical field spike and leakage currents.

Figure 4:
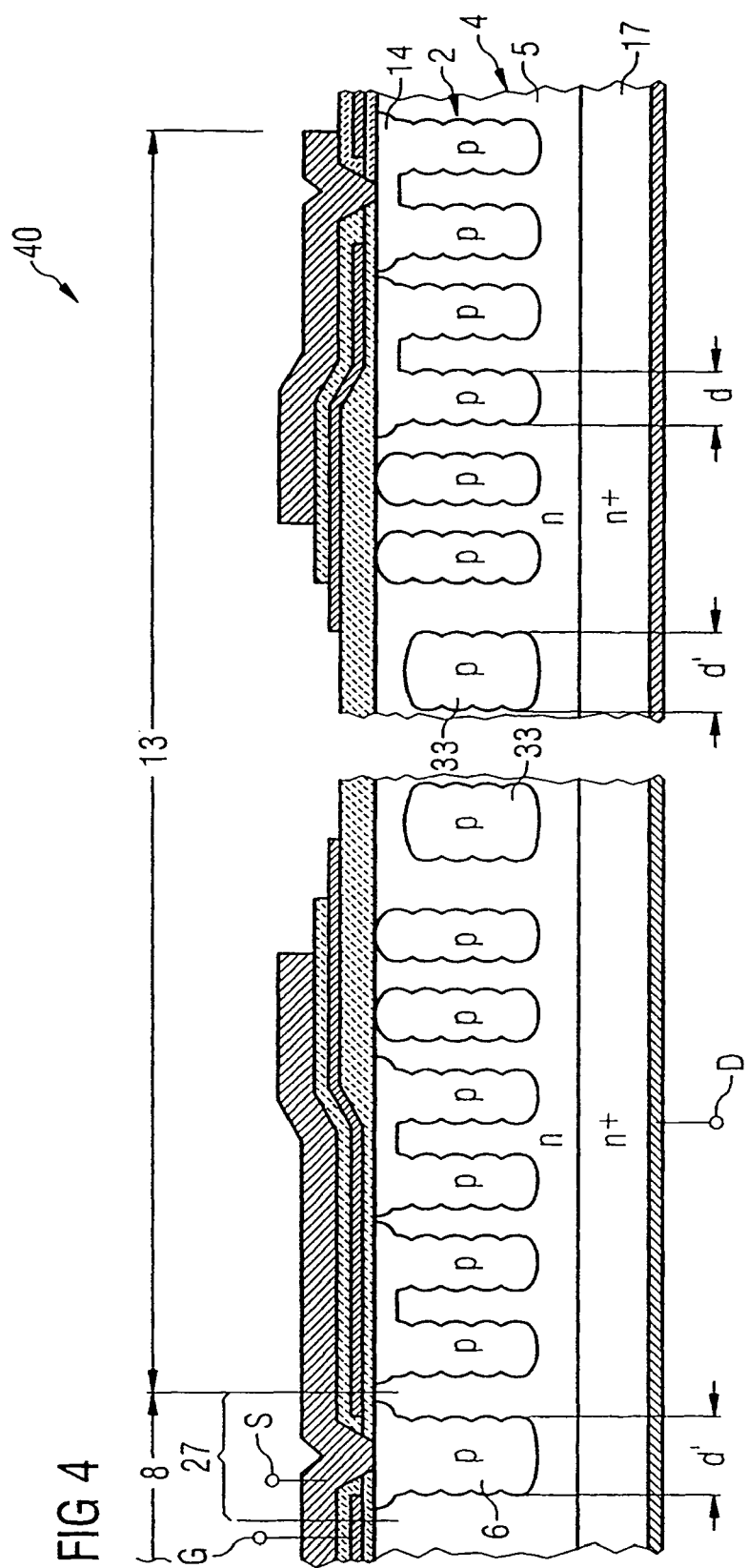
FIG. 4 shows a diagrammatic cross section through a semiconductor chip of a semiconductor power device of a fourth embodiment of the invention.

FIG. 4 shows a diagrammatic cross section through a semiconductor chip 4 of a semiconductor power device 40 of a fourth embodiment of the invention. Components with functions identical to those of the previous figures are identified by the same reference symbols and are not discussed in any greater detail. In this case, headless p-conducting pillars 33 are provided in the corridor region 13, the diameter d' of said pillars being greater than the diameter d of pillar structures that reach as far as the top side of the semiconductor chip in the corridor region B. A charge compensation cell 27 is arranged in the left-hand edge region of the cross section of FIG. 4, the p-conducting pillar 6 of said charge compensation cell having the same diameter d' as the headless p-conducting pillars 33 in the corridor region 13.

Figure 5:
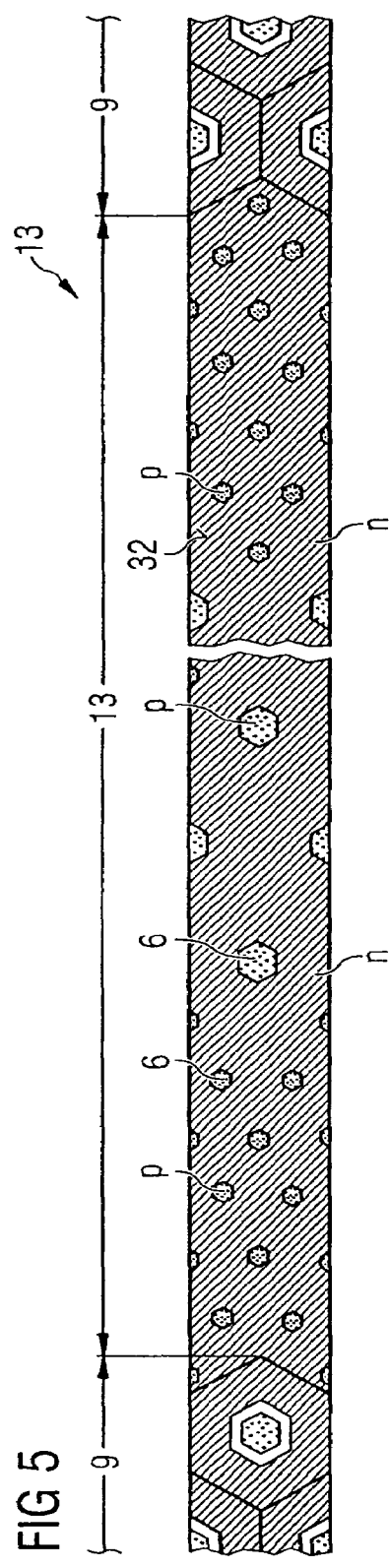
FIG. 5 shows a diagrammatic plan view of an active top side of a semiconductor chip according to FIG. 4 with a corridor.

FIG. 5 shows a diagrammatic plan view of an active top side of a semiconductor chip 4 in accordance with FIG. 4 with a detail from a corridor 13. A plurality of p-conducting pillars 6 are provided in said corridor 13, said pillars having different diameters and, as shown in FIG. 6, reaching as far as the active top side 32 in the corridor region 13.

Figure 6:
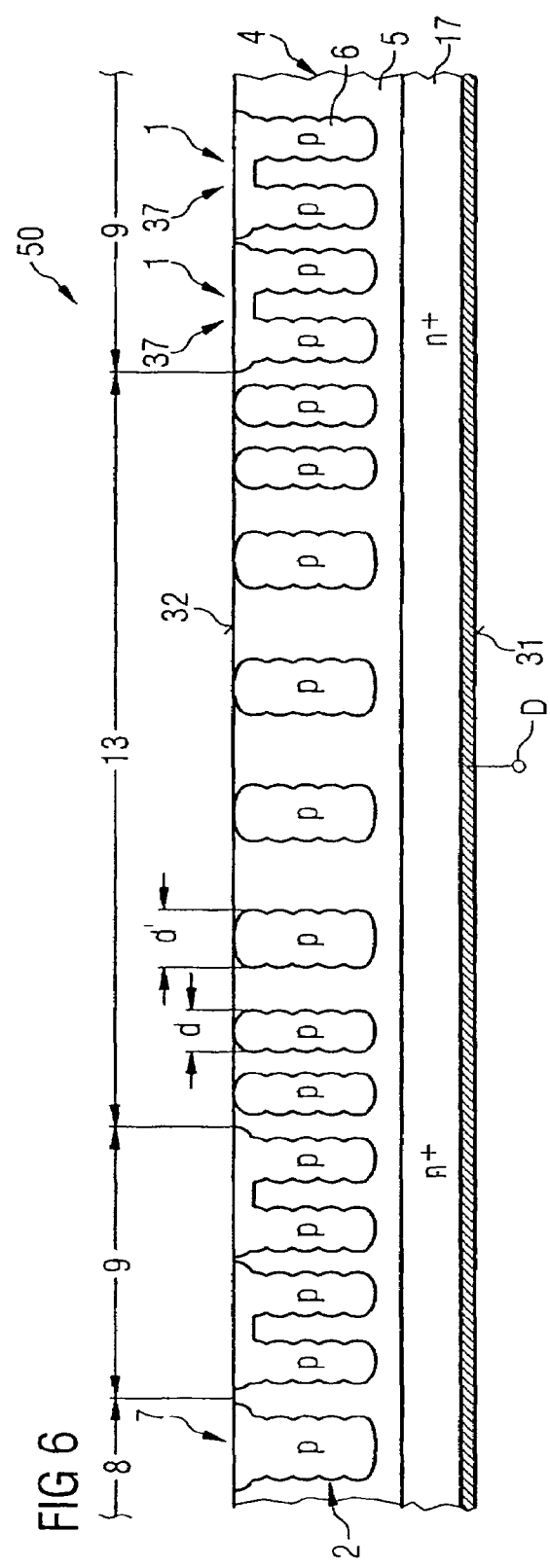
FIG. 6 shows a diagrammatic cross section through a semiconductor chip in the region of a corridor of a semiconductor device of a fifth embodiment of the invention.

FIG. 6 shows a diagrammatic cross section through a semiconductor chip 4 in the region of a corridor 13 of a semiconductor power device 50 in accordance with a fifth embodiment of the invention. The difference from the fourth embodiment of the invention as shown in FIG. 4 consists in the fact that, in the corridor region 13, all the p-conducting pillars extend as far as the top side 32 of the semiconductor chip and have different diameters d and d' in order to achieve a decoupling between the semiconductor circuit elements 1 of the region 9 for a monolithic integrated circuit 3 with n-channel MOS transistors 37 and the semiconductor power elements 7 of the region 8 of the semiconductor power elements 7.

FIGS. 7 to 12 show schematic sketches of individual intermediate products during the fabrication of a charge compensation cell 27 of a semiconductor power element 7.

Figure 7:
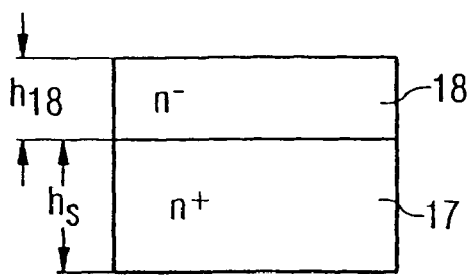

Such a power compensation structure is constructed, as shown in FIG. 7, on a substrate 17 that has a thickness $h_s$ of 90 to 200 μm and is doped with arsenic or phosphorus with a concentration of a few $10^{18}$ to $10^{21}$ cm$^{-3}$, so that it becomes n$^+$-conducting. An n$^-$-conducting epitaxial layer 18 having a thickness $h_1$ of 5 to 30 μm is grown on said n$^+$-conducting semiconductor wafer as substrate 17.

Figure 8:
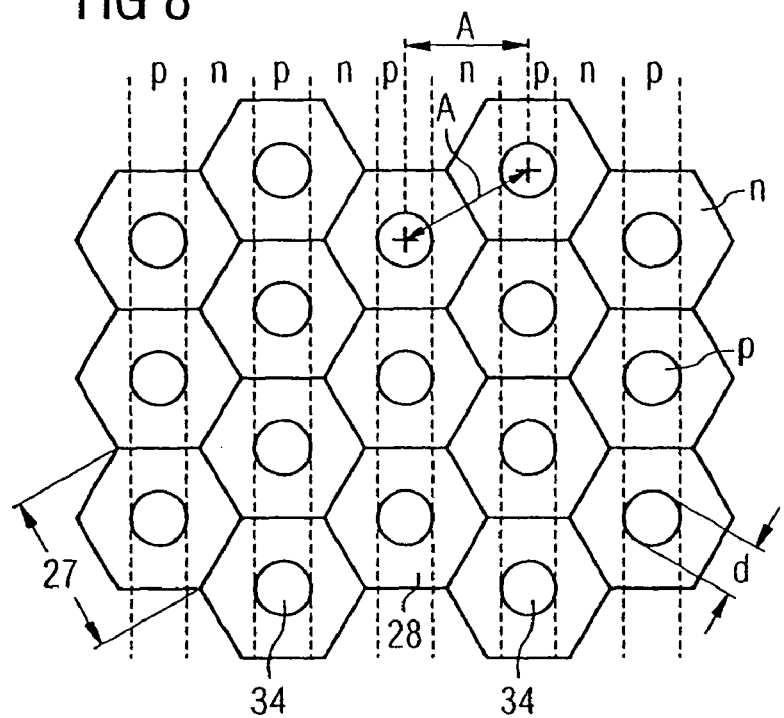

FIG. 8 shows a diagrammatic plan view of a photolithography mask with openings for an ion implantation. Such a mask has honeycomb-shaped cells 27 which exhibit, in their center, an opening 34 with a diameter d for an acceptor zone. Said acceptor zone is intended to be implanted through the openings of the photolithography mask, as shown in FIG. 8, into the first epitaxial layer 18, as shown in FIG. 7. Boron ions that impinge on such a photolithography mask are masked by the photoresist of the individual cells 27 and penetrate only in the region of the openings 34 into the top side of the epitaxial layer 18 shown in FIG. 7. The openings 34 have a distance a between their centers that corresponds to the distance between the centers of the later p-conducting pillars of the charge compensation structure. Consequently, a cell volume region 28 is formed in the charge compensation cells 27, which cell volume region is not redoped and thus remains n—conducting, while the center takes up a p-conducting source of boron atoms.

In an alternative shown by dashed lines in FIG. 8, the ion implantation mask has a strip pattern, so that strip-type charge compensation cells are possible in the case of which p-conducting parallelepipeds doped complimentarily to the semiconductor volume arise in place of p-conducting pillars.

Figure 9:
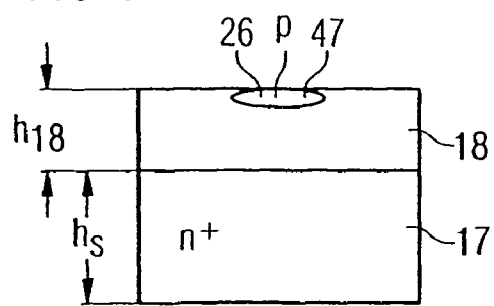

FIG. 9 shows a diagrammatic cross section through the substrate 17 in accordance with FIG. 7 with an implanted acceptor ion source 47. In this case, the acceptor is boron and propagates below the opening 34— shown in FIG. 8—of the photolithography mask shown there in the n$^-$-conducting epitaxial layer 18.

FIG. 10 shows the substrate 17 with x+1 and/or with x+2 epitaxial layers and with x acceptor sources 47 after corresponding epitaxy and ion implantation steps. In this case, each of the p-conducting sources 47 is surrounded by an n$^-$-conducting epitaxial material of the epitaxial layers 18 to x. However, the p-conducting sources 47 still do not form a contiguous vertical pillar or a vertical strip-type parallelepiped in the epitaxial layers 18 to x having epitaxial layer heights $h_{18}$ to $h_x$.

FIG. 11 shows the substrate 17 of FIG. 7 with x+1 and/or x+2 epitaxial layers and a diffused, p$^-$-conducting zone 6. These contiguous zones 6 made of p$^-$-conducting material having a diameter d are achieved by diffusion processes of the sources p of FIG. 10 at temperatures of above 800° C. and up to 1 250° C. For a number of hours. In this case, the desired doping profile is achieved in the form of pillars and/or parallelepidal strips. The total height $h_e$ of the epitaxial layers lies between 30 and 90 μm.

FIG. 12 shows a diagrammatic cross section through two semiconductor power elements 7 lying next to one another with a source terminal S in the top region of the p$^-$-conducting pillar 6, into which a p$^+$-conducting layer 48 is indiffused for reduction of the contact resistance and adaptation of the work functions between the metal of the source electrode S and the semiconductor material of the p-conducting pillar. By means of a gate oxide 35, the gate electrode G is arranged above the gate channel made of n-conducting material so that a current can flow upon application of a corresponding gate voltage between the source electrode S on the top side 32 of the semiconductor chip 4 and the drain electrode D on the rear side of the semiconductor chip 4.

The procedure for fabricating the monolithic integrated circuit is not discussed in any greater detail, but during the method for fabricating such a monolithic module comprising semiconductor power elements and semiconductor circuit elements, a considerable portion of the method steps are performed simultaneously on both regions, namely on the region of the semiconductor power elements 7 and on the region of the semiconductor circuit elements 1, in order that the costs of the method and the costs for fabricating such a semiconductor power device are kept as low as possible.

We claim:

1. A semiconductor power device with charge compensation structure and monolithic integrated circuit on a semiconductor chip, the charge compensation structure with charge compensation cells comprising zones in the cells that are arranged vertically and doped complimentarily to the semiconductor chip volume or to the cell volume, both in the region of the semiconductor power elements of the semiconductor chip and in the region of the semiconductor circuit elements of the monolithic integrated circuit, and the complimentarily doped zones extending right into the surface regions of the semiconductor power elements and not projecting into surface regions of the semiconductor circuit elements.

2. The semiconductor power device as claimed in claim 1, wherein pillars are provided as complimentarily doped and vertically arranged zones.

3. The semiconductor power device as claimed in claim 1, wherein strip-type parallelepipeds are provided as complimentarily doped and vertically arranged zones.

4. The semiconductor power device as claimed in claim 1, wherein a corridor surrounding the monolithic integrated circuit is provided between the region of the semiconductor power elements and the region of the semiconductor circuit elements, in which corridor the zones of the charge compensation structure have a greater distance from one another than in the region of the semiconductor power elements.

5. The semiconductor power device as claimed in claim 1, wherein a corridor surrounding the monolithic integrated circuit is provided between the region of the semiconductor power elements and the region of the semiconductor circuit elements, in which corridor pillars are provided as complimentarily doped zones, which have a smaller diameter than in the region of the semiconductor power elements.

6. The semiconductor power device as claimed in claim 1, wherein the semiconductor circuit elements are surrounded by complimentarily doped wells in the region of the semiconductor circuit elements of the integrated circuit.

7. The semiconductor power device as claimed in claim 1, wherein for a well made of n-conducting material, the charge compensation structure does not project into the well region, and the charge compensation cells have p-conducting pillars whose upper region is widened below the well in such a way that the cell volume in the upper region is also p-conducting, and the upper regions form a closed p-conducting layer that downwardly delimits the n-conducting well.

8. The semiconductor power device as claimed in claim 7, wherein for a well made of n-conducting material, in the region of the semiconductor circuit elements, the edges of the well are surrounded by a charge compensation structure with p-conducting zones, the zones extending with their head regions as far as the top side of the semiconductor material of the semiconductor chip, and the head region of the p-conducting zones being widened in such a way that the cell volume in the head region is p-conducting and the well is laterally delimited by p-conducting material.

9. The semiconductor power device as claimed in claim 1, wherein for a well made of p-conducting material, the charge compensation structure ends with p-conducting zones below the well, and in the n-conducting pillar-free region near the surface, a conducting well is arranged in large-area fashion in comparison with the cross section of the charge compensation cells the head regions of the p-conducting zones being at a vertical distance from the p-conducting well that is greater than or equal to the width of the p-conducting zones.

10. The semiconductor power device as claimed in claim 1, wherein the region of the semiconductor power elements has MOS power transistors and the region of the semiconductor circuit elements has CMOS structures.

* * * * *